United States Patent
Parise

[19]

[11] Patent Number: 5,936,193
[45] Date of Patent: Aug. 10, 1999

[54] NIGHTTIME SOLAR CELL

[76] Inventor: Ronald J. Parise, 101 Wendover Rd., Suffield, Conn. 06078

[21] Appl. No.: 08/933,789

[22] Filed: Sep. 19, 1997

Related U.S. Application Data

[60] Provisional application No. 60/046,027, May 9, 1997.

[51] Int. Cl.⁶ .................................................. H01L 35/30
[52] U.S. Cl. ............................ 136/205; 136/206; 136/246
[58] Field of Search .................................... 136/200, 201, 136/205, 206, 243, 246

[56] References Cited

U.S. PATENT DOCUMENTS

| | | | |
|---|---|---|---|
| 2,984,696 | 3/1961 | Shaffer | 136/4 |
| 3,549,960 | 12/1970 | Wedlock | 317/235 |
| 3,781,647 | 12/1973 | Glaser | 322/2 |
| 4,002,499 | 1/1977 | Winston | 136/206 |
| 4,003,638 | 1/1977 | Winston | 350/293 |
| 4,088,116 | 5/1978 | Pastor | 126/270 |
| 4,129,115 | 12/1978 | Wyatt | 126/270 |
| 4,188,571 | 2/1980 | Brunson | 322/2 R |
| 4,234,352 | 11/1980 | Swanson | 136/253 |
| 4,292,579 | 9/1981 | Constant | 322/2 R |
| 4,312,330 | 1/1982 | Holdridge | 350/452 |
| 4,320,247 | 3/1982 | Gatos et al. | 136/255 |
| 4,320,248 | 3/1982 | Yamazaki | 136/255 |
| 4,332,973 | 6/1982 | Sater | 136/246 |
| 4,332,974 | 6/1982 | Fraas | 136/249 |
| 4,338,560 | 7/1982 | Lemley | 322/2 A |
| 4,500,741 | 2/1985 | Morimoto et al. | 136/206 |
| 4,667,059 | 5/1987 | Olson | 136/249 |
| 4,710,588 | 12/1987 | Ellion | 136/206 |
| 4,710,589 | 12/1987 | Meyers et al. | 136/258 |
| 4,828,628 | 5/1989 | Hezel et al. | 136/255 |
| 5,116,427 | 5/1992 | Fan et al. | 136/259 |
| 5,385,615 | 1/1995 | Horne | 136/246 |
| 5,403,404 | 4/1995 | Arya et al. | 136/249 |
| 5,439,533 | 8/1995 | Saito et al. | 136/258 |
| 5,522,944 | 6/1996 | Elazari | 136/248 |

Primary Examiner—Kathryn Gorgos
Assistant Examiner—Thomas H. Parsons
Attorney, Agent, or Firm—Cantor Colburn LLP

[57] ABSTRACT

This invention is a thermoelectric-photovoltaic device for converting electrical energy from both thermal radiation and sunlight. Thermoelectric energy is produced from thermoelectric cells when a temperature difference is present between two different semiconductor materials. Solar energy is produced from photovoltaic cells when two different semiconductor materials are exposed to sunlight. To achieve increased electrical energy production, one of the semiconductor materials is placed in a cell having a reduced pressure atmosphere to increase the radiative energy thermal exchange with the black sky at night.

29 Claims, 4 Drawing Sheets

NIGHTTIME SOLAR CELL

CROSS-REFERENCE TO RELATED APPLICATIONS

This application claims the benefit of U.S. Provisional Application Serial No. 60/046,027 filed May 9, 1997.

BACKGROUND OF INVENTION

1. Field of the Invention

The present invention relates generally to the use of solar and thermal energy and more particularly to the conversion of solar and thermal energy to electrical energy.

2. Prior Art

The conversion of solar energy to electrical energy through the use of photovoltaic cells is well established in the art. Photovoltaic cells are semiconductor components that convert light into useable electrical energy. A typical photovoltaic, commonly referred to as a solar cell, is comprised of an interface between an n-type semiconductor material and a p-type semiconductor material. A thin transparent layer of n-type or p-type material is deposited on a p-type or n-type material respectively to form an active p-n or n-p junction. When the junction is exposed to visible or nearly visible light, in a solar cell application, electron hole pairs, or minority charge carriers, are created at the junction. The minority charge carriers at the n-p interface migrate across the junction in opposite directions producing an electrical potential or an electrical voltage difference. In solar cell applications electrical contacts, sometimes called ohmic contacts, are connected to the n-type and p-type materials on either side of the junction and an ensuing electric current is obtained.

The prior art has disclosed many variations of the basic p-n junction interface. Many of these variations have been attempts to improve the efficiency and effectiveness of the solar cell at absorbing solar energy. For example, a heterojunction photovoltaic device is comprised of stacked p-n junctions of different materials with band gap energies that match different parts of the solar spectrum. U.S. Pat. No. 4,332,974 discloses a multi layer photovoltaic cell wherein the first p-n layer will absorb energy in a particular band of the spectrum while the remaining energy passes through to the next p-n layer. The next subsequent p-n layer in the stack is comprised of materials that absorb a different band of the spectrum from the preceding layer. Each preceding layer acts as a window to the remaining energy of the spectrum that it does not absorb. With the cells arranged in such a fashion the amount of solar energy converted to electrical energy is expanded thus increasing the efficiency of the device.

Another example of a prior art variation of the basic p-n junction is the p-I-n junction. The p-I-n junction is comprised of p-type semiconductor material, n-type semiconductor material separated by an intrinsic-type material semiconductor material. The addition of the intrinsic-type material layer creates a diffusion potential between this layer and the p-type material and the n-type material. The p-I-n device is constructed such that the majority of the incident light energy is absorbed in the intrinsic layer allowing more of the positive and negative charge carriers to diffuse toward their respective p-type and n-type interfaces. This variation on the basic p-n junction enhances the flow of the charge carriers and improves the overall efficiency and effectiveness of the photovoltaic cell.

Typically the individual interfaces of photovoltaic cells are interconnected to form an array or panel to supply electrical power. Regardless of the type of junction, the photovoltaic cells and the resulting arrays are subsequently interconnected in series/parallel connections to supply the required voltage and current output.

There are many cases of prior art wherein photovoltaic cells are enhanced to increase efficiency of a solar panel. For example, U.S. Pat. Nos. 4,002,499, 4,003,638, 4,088,116, 4,129,115, and 4,312,330 all disclose various methods of concentrating the incident light energy entering a photovoltaic cell. The common theme among the above cited examples is the use of a reflective device to collect sunlight distributed over a larger area and focus it upon a photovoltaic cell thereby increasing the amount of incident light energy.

The use of solar panels to convert light energy into thermal energy is also well known in the art. There are many examples of prior art which utilize light energy to passively heat fluid. For instance, U.S. Pat. No. 5,522,944 discloses the use of interconnected tubes disposed within an array of photovoltaic cells for converting solar energy to thermal energy in a fluid disposed within the tubes.

Likewise the use of a thermoelectric generator to convert thermal energy into electric energy is well known in the art. Thermoelectric generators are semiconductor or solid state devices which convert thermal energy to electrical energy directly. Unlike photovoltaic cells however they are restricted to a maximum possible thermal efficiency of $1-(T_L/T_H)$. This relationship is referred to as the Carnot efficiency and is calculated at the operating temperature between the source temperature, $T_H$, and the sink temperature, $T_L$.

Thermoelectric generators can be analyzed by using simple thermodynamic relationships at the macroscopic level unlike photovoltaic cells which normally require extensive analysis at the microscopic level. Simple fundamental relationships are utilized in the area of art to aid in understanding the function of the solid state devices employed in thermoelectric generators.

Thermoelectric generators are based on the Seebeck effect which holds that when two dissimilar materials are exposed to a temperature differential an electric current will be generated at their junction. The suitability of the materials for the thermoelectric device depends primarily on a parameter referred to as the figure of merit. The figure of merit is based on the material type evaluated at the perceived operating temperature of the thermoelectric device. The higher the value of the figure of merit in the temperature range of the thermoelectric device the better suited the materials are for a thermoelectric device. It is well known in the art to optimize the figure of merit for candidate materials by optimizing material geometries along with material types. In order to optimize the figure of merit an area ratio between the n-type and the p-type materials is selected such that the following relationships are satisfied:

$$\frac{A_n}{A_p} = [\rho_n \lambda_p / \rho_p \lambda_n]^{1/2}$$

and $$1_n = 1_p$$

where $A_n$ area of n-type material $A_p$ area of p-type material $\rho_p, \rho_n$ electrical resistivity $\lambda_p, \lambda_n$ thermal conductivity
$l_p, l_n$ Length of area elements.

With the semiconductor materials selected based on the above equations, the figure of merit, Z, is optimized by satisfying the following relationship:

$$Z = \frac{(|\alpha_p| + |\alpha_n|)^2}{[(\rho_n \lambda_n)^{1/2} + (\rho_p \lambda_p)^{1/2}]2}$$

where $\alpha_p, \alpha_n$ Seebeck coefficients.

For the optimum figure of merit, Z, the optimum current, $I_{opt}$, produced by the thermoelectric generator is calculated by the following equation:

$$I_{opt} = \frac{(|\alpha_p| + |\alpha_n|)(T_H - T_L)}{R[\chi + 1]}$$

where $$R = \frac{\rho_n l_n}{A_n} + \frac{\rho_p l_p}{A_p}$$

and
$T_H$, $T_L$ are the high and low temperatures of the source and the sink, respectively.
and $$\chi = [1 + Z((T_H + T_L)/2)]^{1/2}$$

The open circuit voltage for the thermoelectric generator, $V_{oc}$, is calculated by the following equation:

$$V_{oc} = (|\alpha_p| + |\alpha_n|)(T_H - T_L)$$

The specific thermal efficiency of the thermoelectric generator for the optimized conditions then becomes:

$$\eta_{th} = \left[1 - \frac{T_L}{T_H}\right](\chi - 1)/(X + (T_L/T_H))$$

Note that it is not possible for the thermoelectric generator to have a thermal efficiency greater than the previously stated Carnot efficiency and as such $T_L/T_H$ at the operating conditions of the device must be less than one.

An example of a thermoelectric generator is disclosed in U.S. Pat. No. 4,338,560. The thermoelectric generator of the '560 patent discloses a generator that comprises an array of sources and sinks interconnected by n-type and p-type doped material elements. It is disclosed that the sources absorb infrared heat from the earth and the sinks emit excess heat to space.

State of the art photovoltaic cells work well during daylight hours or when there is a sufficient incident light source, while thermoelectric generators tend to work better at night. What is needed is a thermoelectric-photovoltaic cell system with both enhanced terrestrial and space capabilities which employs state of the art design and manufacturing techniques to obtain maximum electrical energy output from the solar cells during daylight and sunlight conditions and from thermoelectric generator cells from temperature differentials.

SUMMARY OF THE INVENTION

The above-discussed and other drawbacks and deficiencies of the prior art are overcome or alleviated by the nighttime solar cell. The nighttime solar cell of the present invention is a thermoelectric-photovoltaic cell which solves many of the problems with state of the art photovoltaic cell and thermoelectric generator. In particular the present invention provides for an array that combines an advanced photovoltaic cell arrangement with an advanced thermoelectric generator system to increase the electrical power generating capability of a solar panel beyond the current state of the art. The present invention combines a thermoelectric generator with a photovoltaic cell in such a way as to have the capability of producing energy during daylight conditions as well as nighttime conditions. The present invention includes embodiments for terrestrial based arrays as well as space deployed arrays.

The nighttime solar cell of the present invention comprises a photovoltaic cell positioned within a thermoelectric generator. The photovoltaic cell functions to produce electrical energy whenever incident light is available. The thermoelectric generator includes a reduced atmosphere cell, junction surfaces and current flow direction circuitry.

The reduced pressure cell insulates one surface junction from the earth's atmosphere to enhance the heat transfer capability with black sky. This enhanced heat transfer increases the temperature differential with another surface junction thereby improving the current producing capacity of the thermoelectric generator during nighttime use. During daylight conditions the thermoelectric generator produces energy by absorbing solar radiation and emitting heat to the earth's atmosphere.

Current flow direction circuitry is employed to first detect the direction of the current produced by the thermoelectric generator and to then properly orient the direction of the current for use or storage.

The above-discussed and other features and advantages of the present invention will be appreciated and understood by those skilled in the art from the following detailed description and drawings.

BRIEF DESCRIPTION OF THE DRAWINGS

Referring now to the drawings wherein like elements are numbered alike in the several Figures.

DETAILED DESCRIPTION OF THE PREFERRED EMBODIMENTS

Figure 1:
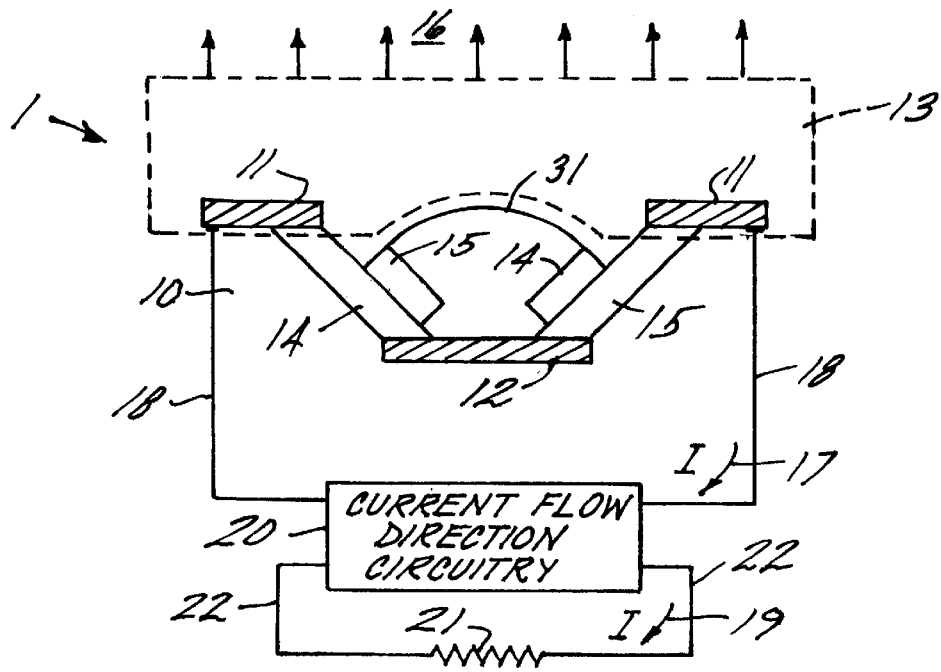
FIG. 1 is a schematic representation of a thermoelectric-photovoltaic cell of the present invention.

An embodiment of the nighttime solar cell of the present invention is shown schematically in FIG. 1. The nighttime solar cell 1 of the present invention includes a thermoelectric generator 10, current flow circuitry 20, and a current load 21. The generator is comprised of a junction surface 11, a junction surface 12, a reduced pressure cell 13, n-type doped material 14, and p-type doped material 15. The schematic presented in FIG. 1 depicts the operation of the present invention in a nighttime terrestrial embodiment. The junction surface 11 emits thermal energy through radiation heat transfer 16 to the black sky at night. In this embodiment junction surface 11 becomes a cold temperature sink for the thermoelectric generator 10. The black sky has an effective temperature around zero degrees absolute temperature which allows the cold temperature sink to radiate heat to the black sky via electromagnetic energy. In a terrestrial embodiment of the present invention the junction surface 12 is the hot temperature source as it is exposed to ambient temperature of around between 255° K to 310° K. The temperature difference that exists between the junction surfaces produces an electrical current 17 in the p-type material and the n-type material of the thermoelectric generator.

The present invention utilizes reduced pressure cell 13 to take advantage of the extremely low temperatures of the black sky. The reduced pressure cell encapsulates the junction surface 11 and insulates them from the ambient temperatures. The ideal pressure of reduced pressure cell 13 would be a perfect vacuum. The reduced pressure cell 13 is manufactured from a material suitable to allow junction surfaces 11 to "see" the black sky and exchange energy with it by radiation heat transfer. The radiative properties of an embodiment of the present invention of junction surface 11 as a cold temperature sink has an emissivity greater than 0.90.

The electric circuit of an embodiment of the nighttime solar cell is also shown in FIG. 1. During nighttime periods, or periods without incident light, current 17 travels in the direction shown from junction surface 11 to current flow direction circuitry 20 via connection 18. Current flow direction circuitry determines the direction of the incoming current 17, and properly orients the current into outgoing current 19 which is carried via connection 22 where it is stored or consumed by load 21.

Figure 2:
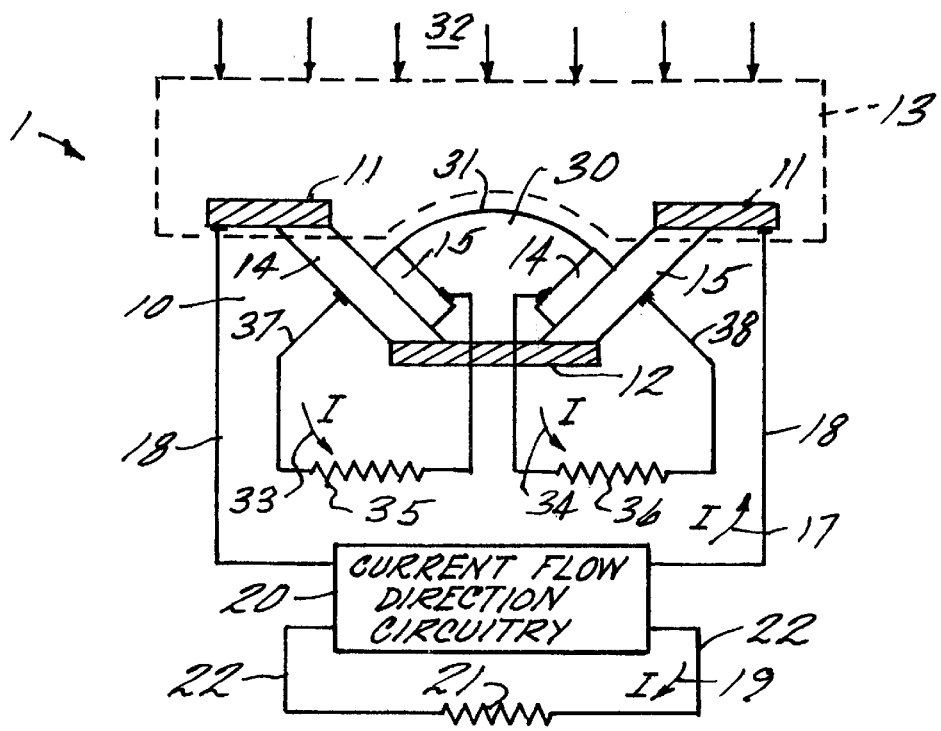
FIG. 2 is a schematic representation of a thermoelectric-photovoltaic cell of the present invention.

Referring next to FIG. 2 there is illustrated a schematic representation of an embodiment of the present invention during daylight operation. In addition to the embodiment previously described the nighttime solar cell illustrated includes a photovoltaic cell 30 comprising concentrating lens 31, n-type doped material 14, and p-type doped material 15. Photovoltaic cell 30 is arranged within thermoelectric generator 10. During daylight operation an embodiment of the present invention produces electrical energy from thermoelectric generator 10 as well as photovoltaic cell 30. Concentrating lens 31 receives solar energy 32 falling between junction surfaces 11 and focuses it upon n-type doped material 14 and p-type doped material 15. Thus configured photovoltaic cell 30 generates current 33,34 which is carried to load 35,36 via connections 37,38.

The operation of a thermoelectric generator during daylight conditions is also illustrated in FIG. 2. During daylight conditions thermoelectric generator 10 functions opposite to that described above for nighttime conditions. Solar energy 32 enters the device and warms junction surfaces 11. The irradiation of solar energy upon junction surface 11 causes the junction surfaces to become the hot junction and the relatively cooler ambient conditions cause junction surface 12 to become the cool junction surface for the thermoelectric generator. In a preferred embodiment, the absorptivity of surface junction 11 is greater than 0.90. In addition, for certain embodiments it is advantageous to select a material for surface junction 11 wherein the emissivity and the absorptivity are nearly equal. Electrical current 17 is generated by the temperature difference between the hot and cold junction surfaces and is opposite in direction to that produced during nighttime operation. Current 17 is carried to current flow direction circuitry 20 wherein its direction is properly oriented into outgoing current 19 and carried to load 21 via connection 22 where it is either stored or consumed.

Although the connections and loads illustrated in FIGS. 1 and 2 are shown as separate they may be combined and interconnected with other such devices as the electrical needs of a particular embodiment dictate. The embodiment shown in FIGS. 1 and 2 may be terrestrial or space based. The important distinguishing characteristic between a terrestrial based application and a space application is the reduced pressure cell. The reduced pressure cell insulates the surface junction of the thermoelectric generator from the earth's ambient surroundings while simultaneously allowing for the surface junction to react radiatively with the sun or the night sky. In space based applications the insulative properties of the reduced pressure cell are not necessary.

Figure 3:
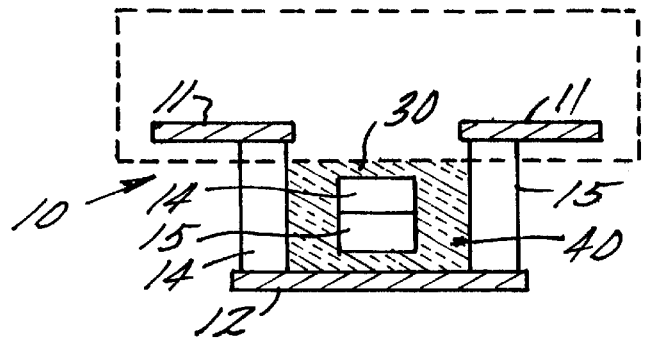
FIG. 3 is a cross sectional view of a thermoelectric-photovoltaic cell of the present invention.

Referring now to FIG. 3 there is illustrated another embodiment of the present invention. This embodiment is configured for terrestrial use and includes, in addition to the embodiments previously described, thermally insulative material 40. Thermally insulative material 40 insulates photovoltaic cell 30 from thermoelectric generator 10. With the two devices thermally insulated the performance of the thermoelectric generator is not influenced by any thermal transfer from the photovoltaic cell, and the overall performance of the nighttime solar cell is enhanced. In addition the photovoltaic cell is not influenced by the thermoelectric generator. The embodiment shown in FIG. 3 may also advantageously include a concentrating lens as previously described.

Figure 4:
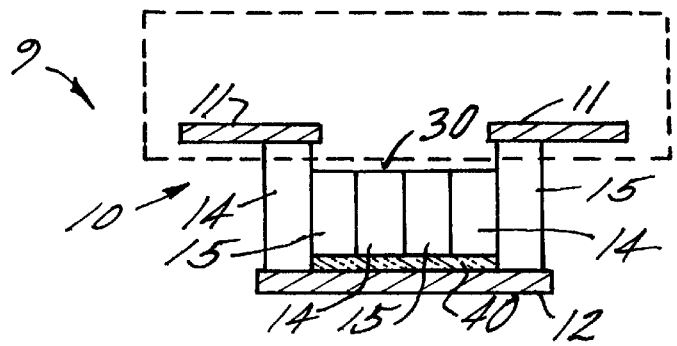
FIG. 4 is a cross sectional view of a thermoelectric-photovoltaic cell of the present invention.

Referring next to FIG. 4 there is illustrated another embodiment of the present invention. In the embodiment illustrated the photovoltaic cell 30 includes n-type 14 and p-type 15 materials connected in series with n-type 14 and p-type 15 materials of the thermoelectric generator 10 to yield a series thermoelectric-photovoltaic device 9. In this particular embodiment the charge carrier collection capability, or the current flow, of the device is greatly improved.

Figure 5:
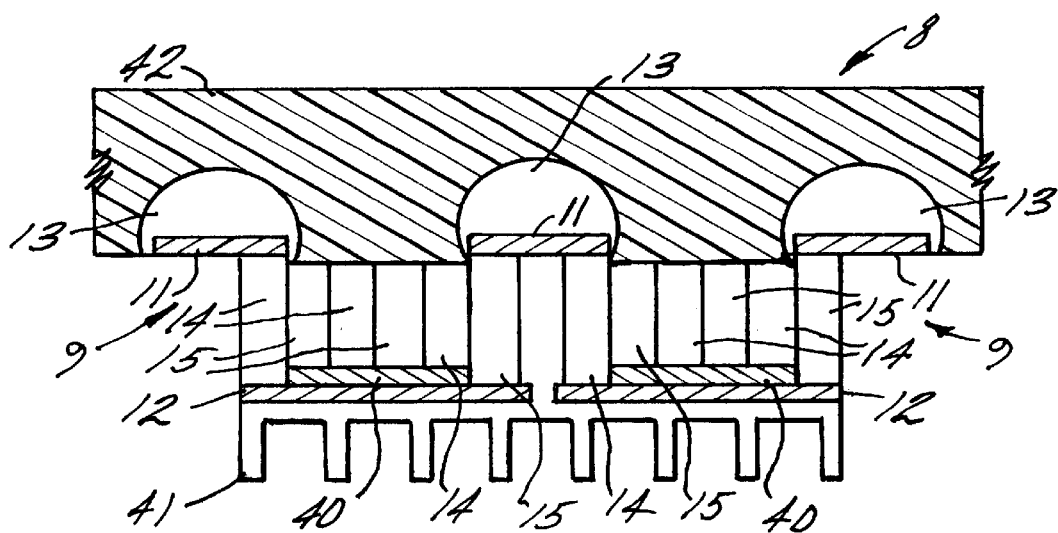
FIG. 5 is a cross sectional view of an array incorporating a thermoelectric-photovoltaic cell of the present invention.

Illustrated in FIG. 5 is still another embodiment of the present invention. The partial array 8 illustrated includes a pair of series thermoelectric-photovoltaic devices, heat transfer fins 41, and encapsulant 42. Heat transfer fins 41 are disposed in heat exchange relationship with junction surfaces 12 and the ambient air. During nighttime operation the heat transfer fins enhance the conduction of heat from the ambient air to the junction surfaces, and during daylight conditions the heat transfer fins improve the transfer of heat from the junction surfaces to the ambient air. Encapsulant 42, essentially a cover, is bonded to junction surfaces 11 under reduced pressure conditions to form reduced pressure cells 13.

Figure 7:
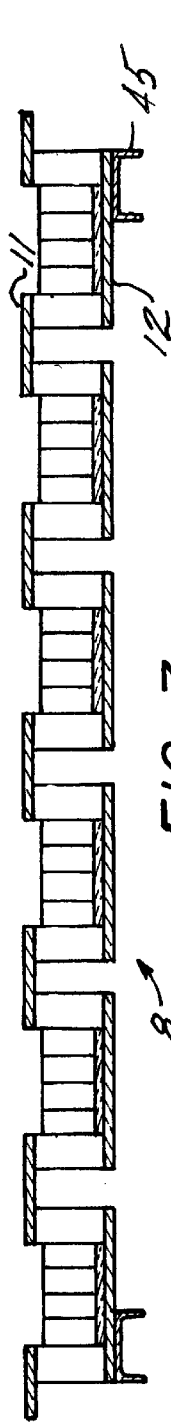
FIG. 7 is a cross sectional view of an array panel and support structure incorporating a thermoelectric-photovoltaic cell of the present invention.
Figure 6:
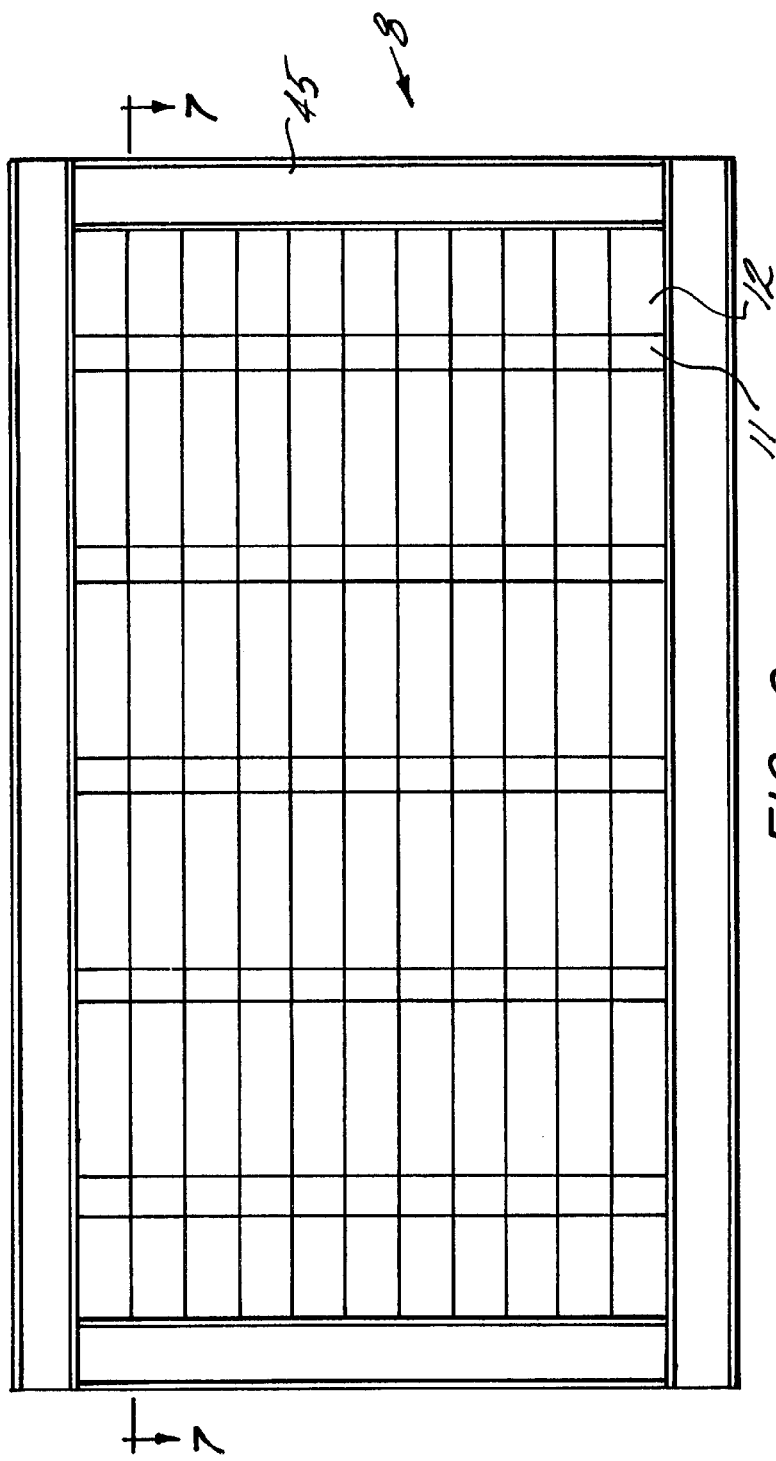
FIG. 6 is a plan view of an array panel and support structure incorporating a thermoelectric-photovoltaic cell of the present invention.

Referring next to FIGS. 6 and 7 there is illustrated an array of the thermoelectric-photovoltaic device of the present invention. In this embodiment there are included support rails fixedly attached to array 8. This embodiment is particularly suited for electrical power generation in connection with a device in a low-earth orbit. With the support rail disposed as illustrated the array would be oriented such that surface junction 12 would be the hot junction and junction surface 11 would be the cold junction. Because the ambient atmosphere of space has a reduced atmosphere, this embodiment would not require the reduced pressure cell. A similar support structure could be envisioned for mounting the array from the opposite side.

Figure 8:
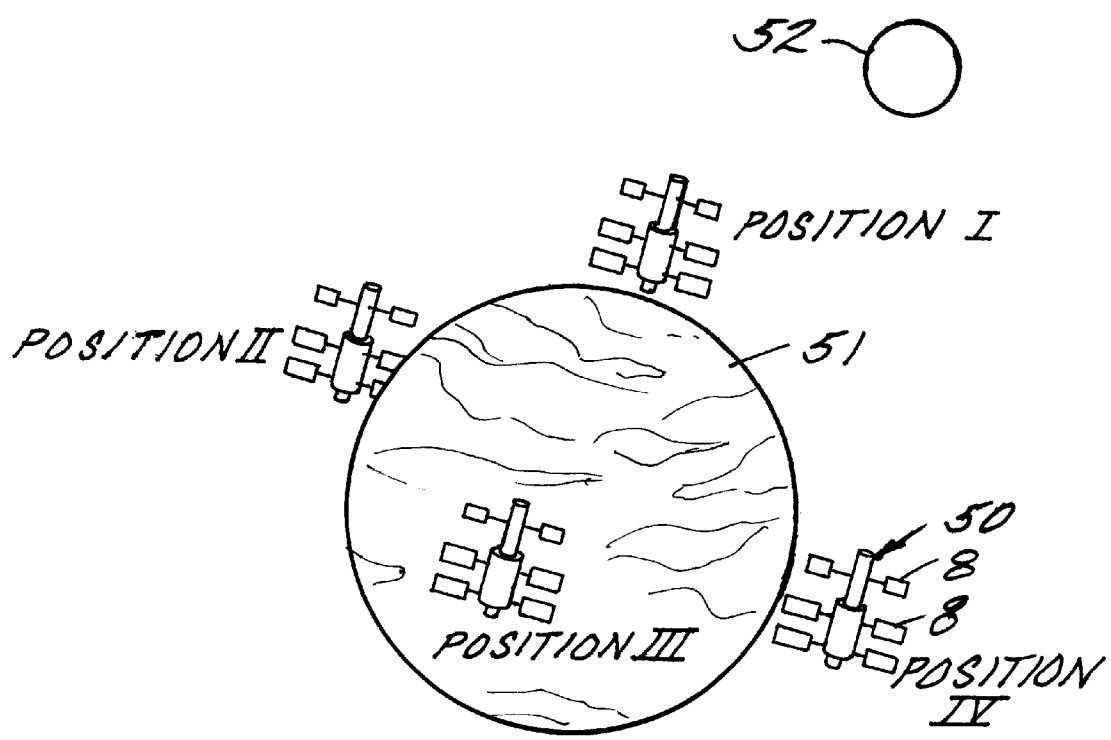
FIG. 8 is a perspective illustration of a satellite incorporating a thermoelectric-photovoltaic cell of the present invention.

Referring finally to FIG. 8 there is illustrated a satellite 50 employing an embodiment of the present invention. Satellite 50 is illustrated in a low orbit about earth 51 including panel arrays 8 positioned about its exterior. The array panels are oriented such that there is always a hot side of the array and a cold side of the array. For example at position I as depicted in FIG. 8 the hot side of the thermoelectric generator and the photovoltaic cells are facing the sun 52. In position I the thermoelectric-photovoltaic array is producing electrical energy to power the satellite from both the thermoelectric generator as well as the photovoltaic cells. In positions II and IV a portion of array 8 is shadowed by the earth and a portion is in direct sunlight. In these positions the photovoltaic cells in sunlight are producing energy while the photovoltaic cells in the shadow of the earth are not. At the same time the thermoelectric generators in sunlight are producing energy by absorbing solar radiation and emitting heat to the ambient atmosphere while the thermoelectric generators in the shadow of the earth are absorbing heat from the ambient atmosphere and emitting heat to black sky. In position III all of the arrays are in the shadow of the earth while the backside of the arrays are facing deep space. In this position the photovoltaic cells are not functioning to produce energy. The thermoelectric generators are producing electrical energy by absorbing heat from the ambient atmosphere and emitting heat to deep space.

The thermoelectric-photovoltaic device of the present invention solves many of the problems of the prior art. In a terrestrial setting during nighttime conditions the reduced pressure cells surrounding the cold junction surfaces of the thermoelectric generator enhance the heat transfer relationship between the device and the black sky thereby increasing the effectiveness of the device and utilizing the surface area of the device to produce energy at night. During daylight terrestrial operation the device combines photovoltaic cells with thermoelectric generator cells in a staged fashion such that the full surface area of the cell is exposed to sunlight and thermal energy to produce electrical energy. By contrast U.S. Pat. No. 4,710,588 discloses a solar cell in combination with a thermoelectric generator in a series fashion. Because of the series arrangement of the elements the thermoelectric generator cannot effectively absorb thermal energy from the sun during daylight conditions and cannot effectively emit heat to black sky at night. In addition, the basic design of the current invention takes advantage of current state of the art manufacturing techniques using thin film and/or transparent electrical connectors with thin film semiconductor materials.

The embodiments of the present invention set forth feature basic p-type material and n-type material junctions. Embodiments of the inventions do include other configurations including cascading or staging of the materials to improve the efficiency. In addition, the particular type of material for various embodiments includes those known in the art as well as those yet to be developed. For example, most photovoltaic cells in use today employ monocrystalline and polycrystalline silicon. However, more expensive compound semiconductors such as GaAs, InP, and CdTe as well as various ternary and quaternary compounds such as AlGaAs or GaAsInP have shown promise for photovoltaic cell applications. With respect to materials for the manufacture of thermoelectric generators materials such as $Bi_2Te_3$, PbTe, or PbSnTe are quite suitable.

While preferred embodiments have been shown and described, various modifications and substitutions may be made thereto without departing from the spirit and scope of the invention. Accordingly, it is to be understood that the present invention has been described by way of illustration and not limitation.

What is claimed is:

1. A thermoelectric cell comprising:
    a first junction surface having a first temperature disposed in contact with a first semiconductor material;
    a second junction surface having a second temperature disposed in contact with a second semiconductor material;
    a third junction surface having a third temperature disposed in contact with the first semiconductor material and the second semiconductor material; and
    wherein the first temperature and the second temperature are about the same and the third temperature is greater than the first temperature and the second temperature.

2. A thermoelectric cell comprising:
    a first junction surface having a first temperature disposed in contact with a first semiconductor material;
    a second junction surface having a second temperature disposed in contact with a second semiconductor material;
    a third junction surface having a third temperature disposed in contact with the first semiconductor material and the second semiconductor material; and
    wherein the first temperature and the second temperature are about the same and the third temperature is less than the first temperature and the second temperature.

3. A thermoelectric cell comprising:
    a first junction surface disposed in contact with a first semiconductor material;
    a second junction surface disposed in contact with a second semiconductor material;
    a third junction surface disposed in contact with the first semiconductor material and the second semiconductor material;
    the first and second junction surfaces at a temperature different from the third surface junction producing a thermoelectric potential between the first and second junction surfaces;
    the thermoelectric potential having an electrical current;
    the first and second junction surfaces electrically connected such that the current flows to a current flow direction circuitry;
    the current flow direction circuitry operable to detect the direction of the current;
    the current flow direction circuitry further operable to orient the direction of an output current; and
    the current flow circuitry electrically connected to a load.

4. A thermoelectric cell as set forth in claim 3 further comprising a finned heat exchanger disposed in contact with the third junction surface.

5. A thermoelectric cell as set forth in claim 3 wherein the first junction surface has a first temperature and the second junction surface has a second temperature and wherein the first and second temperatures are about the same and the third junction surface has a third temperature and wherein the third temperature is greater than the first temperature and the second temperature and wherein the current flow direction is positive.

6. A thermoelectric cell as set forth in claim 3 wherein the first junction surface has a first temperature and the second junction surface has a second temperature and wherein the first and second temperatures are about the same and the third junction surface has a third temperature and wherein the third temperature is less than the first temperature and the second temperature and wherein the current flow direction is negative.

7. A thermoelectric cell for use in an environment having an ambient pressure, the thermoelectric cell comprising:

a first junction surface disposed in contact with a first semiconductor material;

a second junction surface disposed in contact with a second semiconductor material;

a third junction surface disposed in contact with the first semiconductor material and the second semiconductor material;

the first and second semiconductor materials disposed within a cell having a pressure less than the ambient pressure; and the first and second junction surfaces at a temperature different from the third surface junction producing a thermoelectric potential between the first and second junction surfaces.

8. A thermoelectric cell positioned between the earth and open space in an ambient pressure within the atmosphere of the earth, the thermoelectric cell comprising:

a first junction surface disposed in contact with a first semiconductor material;

a second junction surface disposed in contact with a second semiconductor material;

the first and second junction surfaces disposed within a cell having a pressure less than the ambient pressure;

a third junction surface disposed in contact with the first semiconductor material and the second semiconductor material; and the first and second junction surfaces in heat exchange relationship with deep space;

the third junction surface in heat exchange relationship with the atmosphere of the earth; the first and second junction surfaces at a temperature different from the third surface junction producing a thermoelectric potential between the first and second junction surfaces.

9. A thermoelectric cell as set forth in claim 8 further comprising a finned heat exchanger disposed in contact with the third junction surface.

10. A thermoelectric cell as set forth in claim 8 wherein the first junction surface has a first temperature and the second junction surface has a second temperature and wherein the first and second temperatures are about the same and the third junction surface has a third temperature and wherein the third temperature is greater than the first temperature and the second temperature and wherein the current flow direction is positive.

11. A thermoelectric cell as set forth in claim 8 wherein the first junction surface has a first temperature and the second junction surface has a second temperature and wherein the first and second temperatures are about the same and the third junction surface has a third temperature and wherein the third temperature is less than the first temperature and the second temperature and wherein the current flow direction is negative.

12. A thermoelectric array comprising a plurality of electrically connected thermoelectric cells for use in an environment having an ambient pressure, the thermoelectric cells comprising:

a first junction surface disposed in contact with a first semiconductor material;

a second junction surface disposed in contact with a second semiconductor material;

the first and second junction surfaces disposed within a cell having a pressure less than the ambient pressure;

a third junction surface disposed in contact with the first semiconductor material and the second semiconductor material; and the first and second junction surfaces at a temperature different from the third surface junction producing a thermoelectric potential between the first and second junction surfaces.

13. A thermoelectric array as set forth in claim 12 wherein the plurality of thermoelectric cells are connected in series fashion.

14. A thermoelectric array as set forth in claim 12 wherein the plurality of thermoelectric cells are connected in parallel fashion.

15. A thermoelectric array comprising a plurality of electrically connected thermoelectric cells, the thermoelectric cells comprising:

a first junction surface disposed in contact with a first semiconductor material;

a second junction surface disposed in contact with a second semiconductor material;

a third junction surface disposed in contact with the first semiconductor material and the second semiconductor material;

the first and second junction surfaces at a temperature different from the third surface junction producing a thermoelectric potential between the first and second junction surfaces; the thermoelectric potential having an electrical current;

the first and second junction surfaces electrically connected such that the current flows to a current flow direction circuitry;

the current flow direction circuitry operable to detect the direction of the current;

the current flow direction circuitry further operable to orient the direction of an output current; and the current flow circuitry electrically connected to a load.

16. A thermoelectric array as set forth in claim 15 wherein the plurality of thermoelectric cells are connected in series fashion.

17. A thermoelectric array as set forth in claim 15 wherein the plurality of thermoelectric cells are connected in parallel fashion.

18. A thermoelectric-photovoltaic cell for converting thermal radiation and sunlight into electrical energy, including a thermoelectric cell and a solar cell, the thermoelectric-photovoltaic cell comprising:

the solar cell exposed to sunlight disposed within the thermoelectric cell exposed to thermal radiation;

the thermoelectric cell having a first junction surface disposed in contact with a first semiconductor material, a second junction surface disposed in contact with a second semiconductor material, a third junction surface disposed in contact with the first semiconductor material and the second semiconductor material, the first and second junction surfaces at a temperature different from the third surface junction producing a thermoelectric potential between the first and second junction surfaces, the thermoelectric potential having an electrical current, the first and second junction surfaces electrically connected such that the current flows to a current flow direction circuitry, the current flow direction circuitry operable to detect a direction of the current;

the solar cell having a pair of electrodes, the electrodes comprised of a first semiconductor material coupled to the second semiconductor material of the thermoelectric cell and a second semiconductor material coupled to the first semiconductor material of the thermoelectric cell, the first and second semiconductor materials of the solar cell converting the sunlight to electrical energy having a solar output current having a direction;

the current flow direction circuitry further operable to orient the direction of a thermoelectric output current to that of the solar current output direction;

the current flow circuitry electrically connected to a load; and the solar cell electrically connected to a load.

19. A thermoelectric-photovoltaic cell as set forth in claim 18 further comprising a finned heat exchanger disposed in contact with the third junction surface.

20. A thermoelectric-photovoltaic cell as set forth in claim 18 wherein the first junction surface has a first temperature and the second junction surface has a second temperature and the third junction surface has a third temperature and wherein the first and second temperatures are about the same and the third is greater than the first and second temperatures and wherein the current flow direction is positive.

21. A thermoelectric-photovoltaic cell as set forth in claim 18 wherein the first junction surface has a first temperature and the second junction surface has a second temperature and the third junction surface has a third temperature and wherein the first and second temperatures are about the same and the third is less than the first and second temperatures and wherein the current flow direction is negative.

22. A thermoelectric-photovoltaic cell as set forth in claim 18 wherein the thermoelectric-photovoltaic cell is disposed in an environment having an ambient pressure and wherein the first and second junction surfaces are disposed within a cell having a pressure less than the ambient pressure.

23. A thermoelectric-photovoltaic cell as set forth in claim 18 wherein the solar cell includes a light concentrating device for focusing sunlight onto the electrodes.

24. A thermoelectric-photovoltaic array for converting thermal radiation and sunlight into electrical energy, comprising a plurality of thermoelectric cells and solar cells electrically connected, the thermoelectric-photovoltaic array comprising:

the solar cells exposed to sunlight disposed within the thermoelectric cells exposed to thermal radiation;

the thermoelectric cells each having a first junction surface having a first temperature disposed in contact with a first semiconductor material, a second junction surface having a second temperature disposed in contact with a second semiconductor material, a third junction surface having a third temperature disposed in contact with the first semiconductor material and the second semiconductor material, the first and second temperatures different from the third temperature producing a thermoelectric potential between the first and second junction surfaces, the thermoelectric potential having an electrical current, the first and second junction surfaces electrically connected such that the current flows to a current flow direction circuitry, the current flow direction circuitry operable to detect a direction of the current;

the solar cells each having a pair of electrodes, the electrodes comprised of a first semiconductor material coupled to the second semiconductor material of the thermoelectric cell and a second semiconductor material coupled to the first semiconductor material of the thermoelectric cell, the first and second semiconductor materials of the solar cell converting the sunlight to electrical energy having a solar output current having a direction;

the current flow direction circuitry further operable to orient the direction of a thermoelectric output current to that of the solar current output direction;

the current flow circuitry electrically connected to a load; and the solar cell electrically connected to a load.

25. A thermoelectric-photovoltaic array as set forth in claim 24 further comprising a finned heat exchanger disposed in contact with the third junction surface.

26. A thermoelectric-photovoltaic array as set forth in claim 24 wherein the first junction surface has a first temperature and the second junction surface has a second temperature and wherein the first temperature and the second temperature are about the same and the third junction surface has a third temperature and wherein the third temperature is greater than the first temperature and the second temperature and wherein the current flow direction is positive.

27. A thermoelectric-photovoltaic array as set forth in claim 24 wherein the first junction surface has a first temperature and the second junction surface has a second temperature and wherein the first temperature and the second temperature are about the same and the third junction surface has a third temperature and wherein the third temperature is less than the first temperature and the second temperature and wherein the current flow direction is negative.

28. A thermoelectric-photovoltaic array as set forth in claim 24 wherein the thermoelectric-photovoltaic array is disposed in an environment having an ambient pressure and wherein the first and second junction surfaces are disposed within a cell having a pressure less than the ambient pressure.

29. A thermoelectric-photovoltaic cell as set forth in claim 24 wherein the solar cell includes a light concentrating device for focusing sunlight onto the electrodes.

* * * * *